(12) United States Patent
Harada

(10) Patent No.: US 7,873,887 B2
(45) Date of Patent: Jan. 18, 2011

(54) BURN-IN TEST CIRCUIT, BURN-IN TEST METHOD, BURN-IN TEST APPARATUS, AND A BURN-IN TEST PATTERN GENERATION PROGRAM PRODUCT

(75) Inventor: Eiji Harada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1050 days.

(21) Appl. No.: 11/619,954

(22) Filed: Jan. 4, 2007

(65) Prior Publication Data

US 2007/0168804 A1    Jul. 19, 2007

(30) Foreign Application Priority Data

Jan. 5, 2006    (JP) ............................ 2006-000538

(51) Int. Cl.
 *G01R 31/28* (2006.01)
(52) U.S. Cl. ...................................... 714/726; 714/716
(58) Field of Classification Search ................. 714/733, 714/739, 727, 729, 726, 716
See application file for complete search history.

(56) References Cited

U.S. PATENT DOCUMENTS

| | | | | |
|---|---|---|---|---|
| 5,173,906 | A * | 12/1992 | Dreibelbis et al. | 714/733 |
| 6,675,338 | B1 * | 1/2004 | Golshan | 714/739 |
| 7,162,673 | B2 * | 1/2007 | Wong | 714/726 |
| 7,237,162 | B1 * | 6/2007 | Wohl et al. | 714/726 |
| 7,752,512 | B2 * | 7/2010 | Hidaka | 714/726 |

FOREIGN PATENT DOCUMENTS

| | | |
|---|---|---|
| JP | 3012570 A | 1/1991 |
| JP | 7-98358 A | 4/1995 |
| JP | 9089996 A | 4/1997 |
| JP | 2002221557 A | 8/2002 |
| JP | 2004-108881 A | 4/2004 |
| JP | 2005-140770 A | 6/2005 |

* cited by examiner

*Primary Examiner*—David Ton
(74) *Attorney, Agent, or Firm*—Sughrue Mion, PLLC

(57) ABSTRACT

A burn-in test circuit according to the present invention includes a scan chain formed by a plurality of scan flip-flips connected in series, a circuit under test input with an output from one of the plurality of scan flip-flops as an activation signal, and a scan chain loop circuit being configured to an output signal of the scan chain determined according to an output of the circuit under test back to the scan chain.

14 Claims, 8 Drawing Sheets

BURN-IN TEST CIRCUIT, BURN-IN TEST METHOD, BURN-IN TEST APPARATUS, AND A BURN-IN TEST PATTERN GENERATION PROGRAM PRODUCT

BACKGROUND OF THE INVENTION

1. Field of the Invention

The present invention relates to a circuit, a method, an apparatus and a pattern generation program product used in a burn-in test for an integrated circuit etc.

2. Description of Related Art

With processes of an integrated circuit including VLSI (Very Large Scale Integrated circuit) becoming more and more detailed, circuits are becoming to be more complicated and increasing their sizes. Along with the development, an issue of how to remove a malfunction in the integrated circuit is increasing its importance. Furthermore, a low-cost burn-in test has been demanded by improving test efficiency to perform a burn-in test for many integrated circuits.

Many of integrated circuits including VLSI employs scan design to detect a malfunction. The scan design is to detect a malfunction in an internal combinational circuit that resides between registers by inputting test data from outside the circuit and scanning an operation result using a shift register formed by registers in the circuit connected together. A circuit performing such scan shift and scan capture operations is referred to as a scan test circuit. The scan test circuit is used in a burn-in test because it is able to efficiently activate the internal combinational circuit, which is a circuit to be tested, by continuously inputting test data.

However to operate the scan test circuit, not only a test pattern but many external signals including a clock signal and a signal for controlling scan operation need to be input. Consequently a signal generation feature such as a pulse generator is required in a burn-in test circuit, and wiring of a burn-in test board becomes complicated, thereby generating a high workload of the burn-in test circuit. Therefore, a high performance burn-in test apparatus is needed, and a cost for a burn-in test is increased. Further, with a large number of input signal terminals from outside, the number of integrated circuits to perform the burn-in test at one time is limited and this deteriorates test efficiency as well as increases the cost for the burn-in test.

Examples of techniques for resolving such problem are disclosed in Japanese Unexamined Patent Application Publication Nos. 07-098358, 2004-108881, and 2005-140770. FIG. 8 illustrates a configuration of a burn-in test circuit of Japanese Unexamined Patent Application Publication No. 07-098358. An integrated circuit 50 is configured by four scan flip-flips (hereinafter referred to as a scan FF) 500 501, 502, and 503, internal combinational circuits 504 to 506 connected between the scan FFs 500 to 503, a logical inverted feedback loop circuit 507, and a feedback loop switching circuit 508.

The four scan FFs 500 to 503 form a scan chain by being connected each other in series. The scan FF 503, a front stage of the scan chain, is connected to a normal input terminal (SI1 terminal) of the integrated circuit 50 via the feedback loop switching circuit 508, and the scan FF 500, a last stage, is connected to a normal output terminal (SO1 terminal) of the integrated circuit 50. The internal combinational circuits 504, 505, and 506 are respectively connected between the scan FFs 500 and 501, between 501 and 502, and between 502 and 503, and are activated by output signals from the scan FFs 501, 502, and 503. The output signal from the scan FF 500 is inverted via the logical inverted feedback loop 507, and input to the feedback loop switching circuit 508. On the other hand, a signal from the logical inverted feedback loop circuit 507 or the SI1 terminal is selectively input to the scan chain by the feedback loop switching circuit 508 that operates according to a signal of a test control terminal (TEST terminal).

With the configuration described in the foregoing, the output signal from the scan FF 500 is inverted by the logical inverted feedback loop circuit 507 in a burn-in test, and repetitions of "0" and "1" are input to the scan chain. Accordingly the outputs from the scan FFs 500, 501, 502, and 503 repeat "0" and "1", thereby efficiently activating the internal combinational circuits 504, 505, and 506.

The burn-in test circuit disclosed in Japanese Unexamined Patent Application Publication No. 07-098358 generates an activation signal in the burn-in test by the logical inverted feedback loop circuit mounted inside the integrated circuit. This therefore reduces the number of input signals from outside the integrated circuit and increases the number of integrated circuits to perform a burn-in test for at one time. Thus an efficiency of the burn-in test can be improved and also cost for the burn-in test can be reduced.

Furthermore, in a burn-in test circuit disclosed in Japanese Unexamined Patent Application Publication No. 2004-108881, the scan shift operation and the scan capture operation are repeated for $2^{(n-1)}$ cycle in a burn-in test according to a signal generated from a BIST (Built In Self Test) circuit mounted inside the integrated circuit. Accordingly the scan control signal is not necessary to be input from outside the integrated circuit, thereby enabling to perform a burn-in test with small number of terminals. This circuit further enables to activate the circuit without decreasing a toggle rate of the circuit, enabling to apply stress of the burn-in test efficiently.

Furthermore, in a burn-in test circuit disclosed in Japanese Unexamined Patent Application Publication No. 2005-140770, the scan shift operation and the scan shift capture operation is switched by a scan control signal selection output circuit that outputs a scan control signal in a burn-in test. Accordingly the scan control signal is not necessary to be input from outside the integrated circuit, thereby enabling to perform a burn-in test with small number of terminals.

However it has now been discovered that in the burn-in test circuit disclosed in Japanese Unexamined Patent Application Publication No. 07-098358, as the activation signal by the logical inverted feedback loop circuit 507 is a repetition of "0" and "1", a degree of activation is lower than a random activation operation. Further, as the logical inverted feedback loop circuit is formed inside the integrated circuit, the burn-in test circuit cannot be modified later.

Moreover in Japanese Unexamined Patent Application Publication No. 2004-108881 and Japanese Unexamined Patent Application Publication No. 2005-140770, as complicated circuits including the BIST circuit and the scan control signal selection output circuit are mounted inside the integrated circuit to increase the number of gates in the integrated circuit, a workload of the integrated circuit increases.

SUMMARY OF THE INVENTION

According to an aspect of the present invention, there is provided a burn-in test circuit that includes a scan chain formed by a plurality of scan flip-flops connected in series, a circuit under test input with an output from one of the plurality of scan flip-flops as an activation signal, a scan chain loop circuit being configured to an output signal of the scan chain determined according to an output of the circuit under test back to the scan chain.

With such configuration, no complicated circuit is required inside the integrated circuit, a degree of activation of the integrated circuit can be increased, and a malfunction in the integrated circuit can efficiently be removed.

According to another aspect of the present invention, there is provided a method for burn-in test for an integrated circuit having a scan chain including a plurality of scan flip-flops connected in series, and a circuit under test that lies between the plurality of scan flip-flops. The method includes feeding an output signal from the scan chain determined according to an output from the circuit under test back to the scan chain, taking the fed back signal in the plurality of scan flip-flops by a scan shift operation, and inputting the output signal from one of the plurality of scan flip-flops to the circuit under test as an activation signal.

With such configuration, the number of input signals from outside the integrated circuit is reduced and wiring of the burn-in test board can be simplified.

With this configuration, a burn-in test circuit and a burn-in test method that are possible to perform a burn-in test having high rate of malfunction detection with low cost.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. The explanation will not be repeated as appropriate for clarity.

First Embodiment

Figure 1:
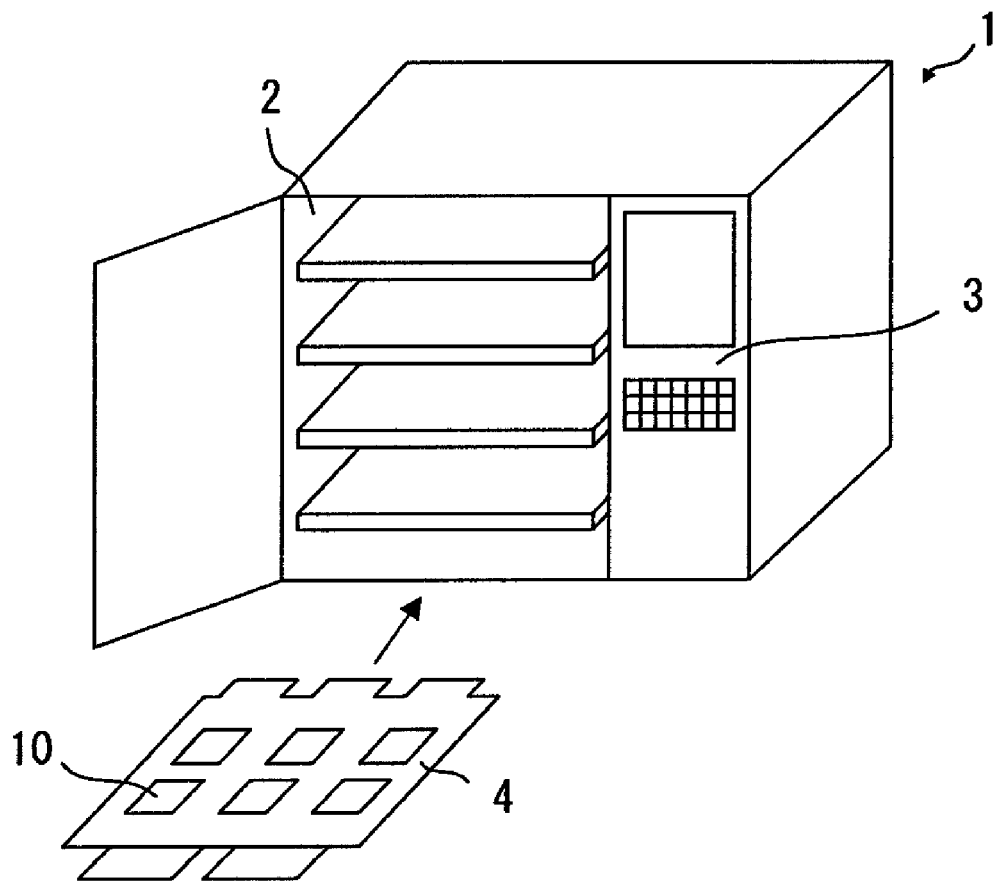
FIG. 1 is a schematic diagram illustrating a burn-in test apparatus according to a first embodiment of the present invention.

A first embodiment of the present invention is described hereinafter in detail with reference to the drawings. FIG. 1 is a schematic diagram illustrating a burn-in test apparatus 1 according to this embodiment. The burn-in test apparatus 1 is configured by a constant temperature oven 2, a control unit 3, and a burn-in board 4. In a burn-in test, the burn-in board 4 housing an integrated circuit 10 to be tested is placed in the constant temperature oven 2 with constant temperature inside. The control unit 3 of the burn-in test apparatus 1 is connected to the burn-in board 4 placed in the constant temperature oven 2 to perform a test operation of the integrated circuit 10 via the burn-in board 4. This causes to apply high temperature stress to the integrated circuit 10, enabling to detect a malfunction latent in the integrated circuit 10.

Figure 2:
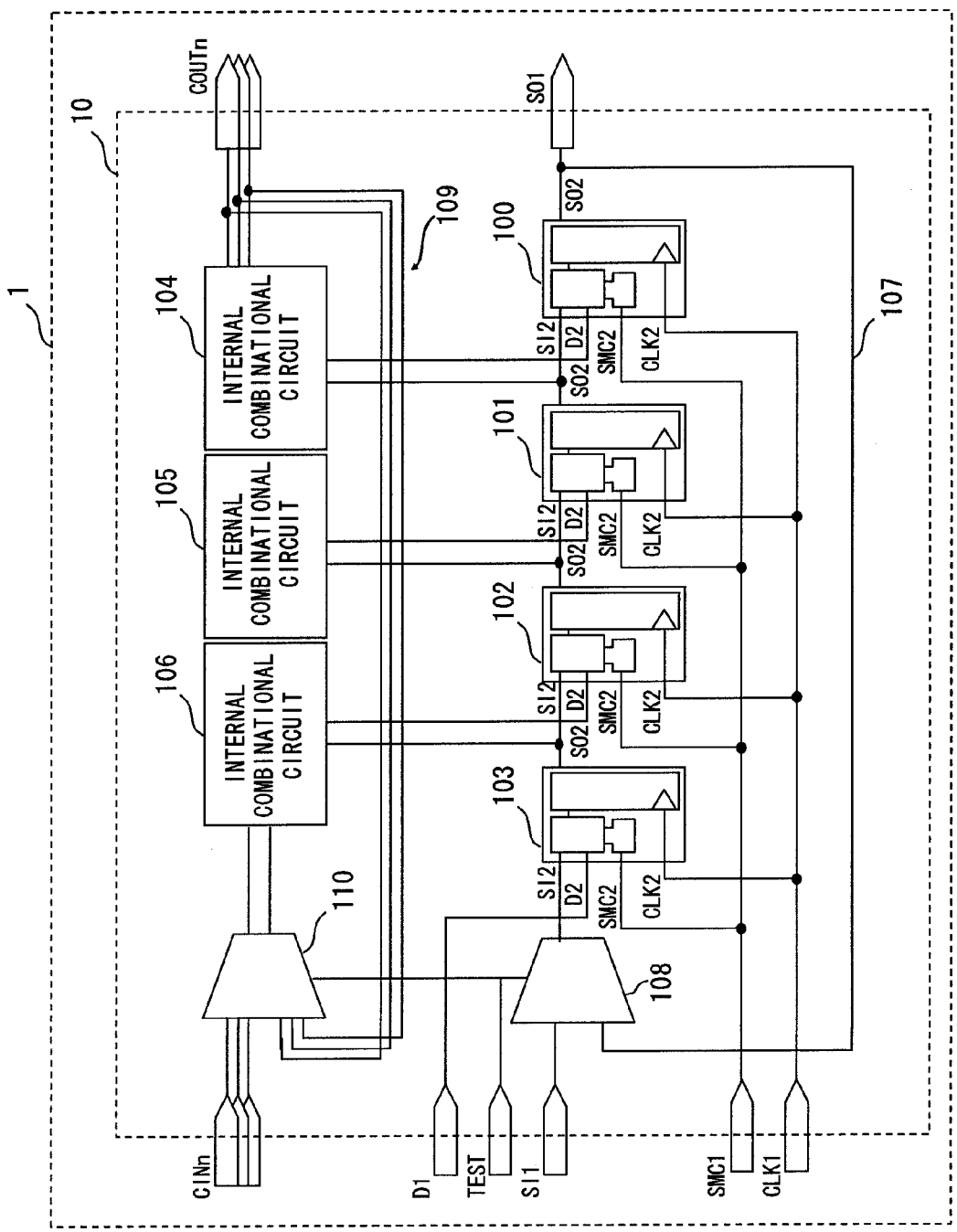
FIG. 2 is a configuration diagram illustrating a burn-in test circuit according to the first embodiment of the present invention.

FIG. 2 is a view showing a configuration of a burn-in test circuit included in the integrated circuit 10. The integrated circuit 10 includes four scan flip-flops (hereinafter referred to as a scan FF) 100 to 103. Internal combinational circuits 104 to 106 are connected between the scan FFs 100 to 103. A logical noninverted feedback loop circuit 107 connects an output from the scan FF 100 with a feedback loop switching circuit 108. The feedback loop switching circuit 108 is a circuit for selecting an input signal to the scan FF 103. A logical noninverted feedback loop circuit 109 connects outputs internal combinational circuits 104 to 106 from the scan FF 100 with a feedback loop switching circuit 108. The feedback loop switching circuit 110 is a circuit for selecting an input signal to the internal combinational circuit 106. The integrated circuit 10 is connected to the control unit 3 of the burn-in test apparatus 1 via the burn-in test board 4 (The burn-in test board 4 is not shown in FIG. 2.).

The integrated circuit 10 includes a data input terminal (hereinafter referred to a D1 terminal), a normal input terminal to the scan FF (hereinafter referred to as a SI1 terminal), a normal output terminal from the scan FF (hereinafter referred to a SO1 terminal), a clock terminal (hereinafter referred to a CLK1 terminal), a scan control terminal (hereinafter referred to a SMC1 terminal), a test control terminal (hereinafter referred to a TEST terminal), a normal input terminal to the internal combinational circuit (hereinafter referred to a CINn terminal), and a normal output terminal from the internal combinational circuit (hereinafter referred to a COUTn terminal).

The scan FFs 100 to 103 each includes a data input terminal (hereinafter referred to a D2 terminal), a normal input terminal (hereinafter referred to a SI2 terminal), a normal output terminal (hereinafter referred to a SO2 terminal), a clock terminal (hereinafter referred to a CLK2 terminal), and a scan control terminal (hereinafter referred to a SMC2 terminal).

The scan FFs 100 to 103 form a scan chain by their SI2 and SO2 terminals connected each other in series. The scan FF 103 is connected to the SI1 terminal of the integrated circuit 10 via the feedback loop switching circuit 108. The scan FF 100 is connected to the SO1 terminal of the integrated circuit. In this embodiment, a fixed value of "0" or "1" is input to the SI1 terminal. The SO1 terminal may either be in a condition in which a fixed value "0" or "1" is input, or in an open condition. Needless to say that the number of scan FFs forming the scan chain is not limited to four.

The logical noninverted feedback loop circuit 107 inputs an output signal from the scan FF 100 to the feedback loop switching circuit 108. The TEST terminal is connected to the feedback loop switching circuit 108. The feedback loop switching circuit 108 selects a signal from the SI1 terminal or a signal from the logical noninverted feedback loop circuit 107 according to a signal from the TEST terminal, and then inputs the selected signal to the SI2 terminal of the scan FF 103.

The SMC1 terminal is connected to the SMC2 terminals of the scan FFs 100 to 103. A signal input to the SMC1 terminal is a control signal for the scan FFs 100 to 103 to select an input signal among signals input to the SI2 terminal and the D2 terminal. The CLK1 terminal is connected to the CLK2 terminals of the scan FFs 100 to 103. A clock signal input to the CLK1 terminal is a trigger to a scan shift and a scan capture operations and so on. The D1 terminal is connected to the D2 terminal of the scan FF 103, and the D1 terminal is input with the fixed value of "0" or "1".

The internal combinational circuit 104 lies between the S02 terminal of the scan FF 101 and the D2 terminal of the scan FF 100. Similarly the internal combinational circuit 105 lies between the S02 terminal of the scan FF 102 and the D2 terminal of the scan FF 101. The internal combinational circuit 106 lies between the S02 terminal of the scan FF 103 and the D2 terminal of the FF 102. The internal combinational circuits 104, 105, and 106 are activated by signals input from the scan FFs 101, 102, and 103 respectively. The internal combinational circuit 106 is connected to the CINn terminal of the integrated circuit 10 via the feedback loop switching circuit 110. In this embodiment, a fixed value "0" or "1" is input to the CINn terminal. The COUTn terminal may either be in a condition in which a fixed value "0" or "1" is input, or in an open condition.

The logical noninverted feedback loop circuit 109 inputs output signals from the internal combinational circuits 104 to 106 to the feedback loop switching circuit 110. The TEST terminal is also connected to the feedback loop switching circuit 110. The feedback loop switching circuit 110 selects a signal from the CINn terminal or a signal from the logical noninverted feedback loop circuit 109 according to a signal from the TEST terminal and then outputs the selected signal to the internal combinational circuit 106.

Figure 3:
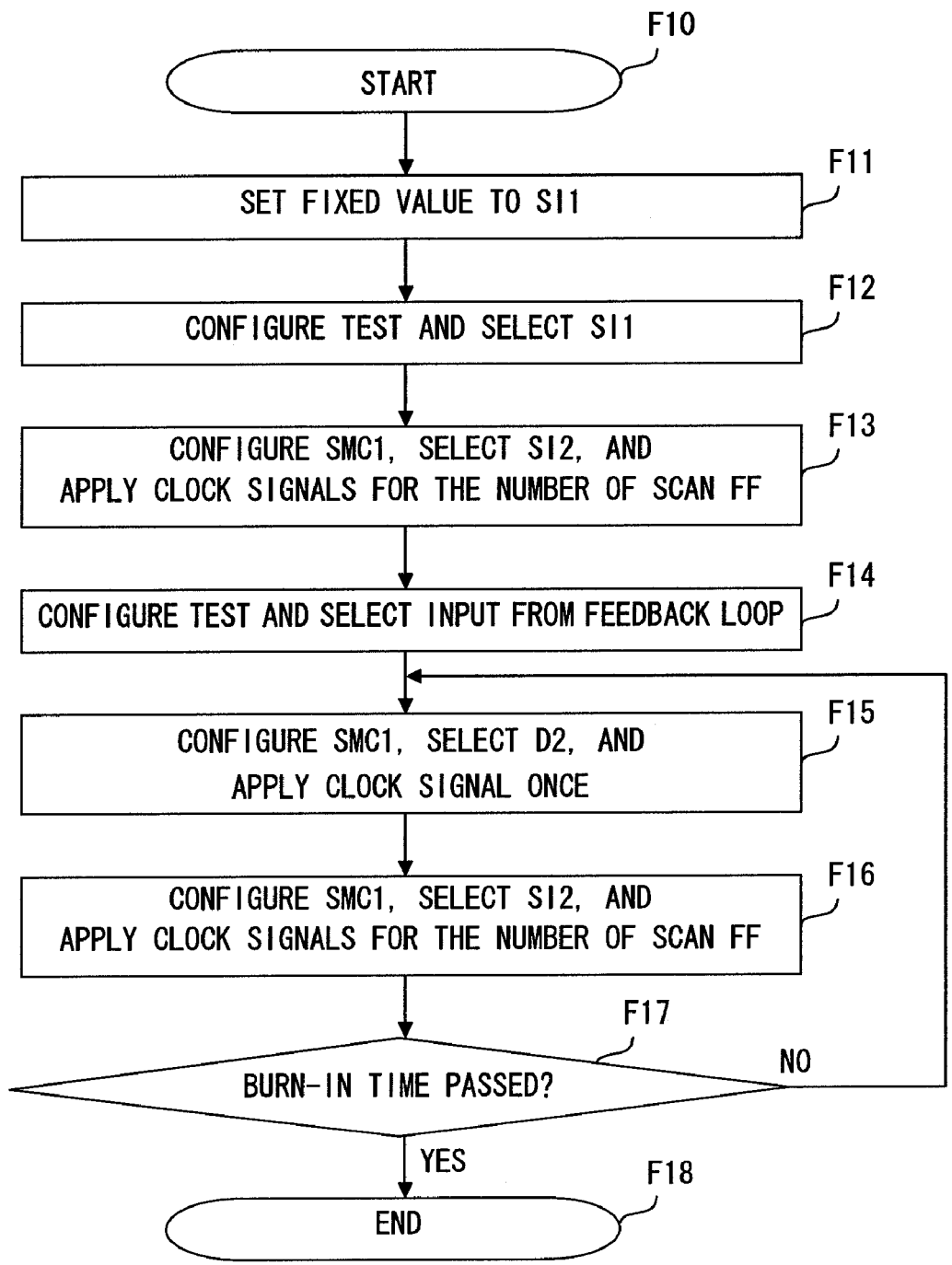
FIG. 3 is a flowchart illustrating a burn-in test pattern generation program according to the first embodiment of the present invention.

A burn-in test method of the first embodiment is described hereinafter in detail with reference to FIG. 3. FIG. 3 is a flowchart illustrating the burn-in test method of this embodiment. The burn-in test method is executed by the control unit 3 executing a test pattern generation program describing the process shown in the flowchart of FIG. 3.

An initial state in the burn-in test is that the fixed value is supplied to the SI1 terminal of the integrated circuit 10 (F11). The fixed value is assumed to be "1" here but may be set to "0".

Then the signal of the TEST terminal is configured so that an input from the SI1 terminal is selected by the feedback loop switching circuit 108 (F12). This enables the fixed value input to the SI1 terminal to be able to supply to the scan FFs 100 to 103.

Then the SMC1 terminal is configured so that the signal input to the SI2 terminal is selected instead of the signals from the D1 terminal and the internal combinational circuits 104, 105, and 106 as an input signal for supplying data to be stored in the scan FFs 100 to 103. After that clock signals for the number of cycles corresponding to the scan FFs are applied (F13). This causes a scan shift operation of the scan FFs 100 to 103, sequentially taking the signals input to the SI1 terminal in the scan FFs 100 to 103. Specifically, outputs from the scan FFs 100 to 103 are set to "1" The clock signal may be applied any number of times not limited to the number of scan FFs as long as it is applied once.

Then the TEST terminal is configured so that the signal from the logical noninverted feedback loop circuit 107 is selected by the feedback loop switching circuit 108 (F14). This enables the output signal from the scan FF 100 to be supplied to the scan FFs 100 to 103. Further, the TEST terminal maybe configured so that the signal from the logical noninverted feedback loop circuit 109 is selected by the feedback loop switching circuit 110. This causes a signal from the internal combinational circuit 104, for example, to be supplied to the internal combinational circuit 106. Note that the signal input to the internal combinational circuit 106 is not limited to the signal from the internal combinational circuit 104.

After that, the SMC1 terminal is configured so that the signals input to the D2 terminals of the internal combinational circuits 104 to 106 are selected as an input signal for supplying data to the scan FFs 100 to 103. Then one pulse of a clock signal is applied to the CLK1 terminal (F15). This causes a scan capture operation that takes the signal from the D1 terminal or the signals from the internal combinational circuits 104 to 106 in the scan FFs 100 to 103, and the outputs from the scan FFs 100 to 103 to be set as an input signal from the D1 terminal or input signals from the internal combinational circuits 104 to 106.

The internal combinational circuits 104 to 106 have various logics. Thus with combinations with the same signals being input, outputs will be different random values depending on the logics. In this embodiment, random output signal of the internal combinational circuit 104 etc is supplied to the internal combinational circuit 106 by the logical noninverted feedback loop circuit 109. That is, even in case the input terminals of the scan FFs 100 to 103 are switched to the D2 terminals, random signal from the logical noninverted feedback loop circuit 109 is input to the internal combinational circuit 106 instead of the fixed value from the D1 terminal via the scan FF 103.

Then the SMC1 terminal is configured so that the signal of the SI2 terminal or the scan FF (i.e. signal input to the SI2 terminal) is input to the scan FFs 100 to 103 instead of the signals from the D1 terminal or the internal combinational circuits 104 to 106. After that, clock signals are applied to the CLK1 terminal for cycles corresponding to the number of scan FFs (F16). This causes a scan shift operation for the scan FFs 100 to 103, changing all the output from the scan FFs 100 to 103. The clock signal may be applied any number of times not limited to the number of scan FFs as long as it is applied once.

After repeating the operations of F15 and F16 for the predefined burn-in test time (F17), the burn-in test is completed.

As described in the foregoing, by the logical noninverted feedback loop circuit 107 reinputting signal values generated by the internal combinational circuits 104 to 106 inside the integrated circuit 10 to the internal combinational circuits 104 to 106, the activation signal becomes a random signal instead of the fixed repetition of "0" and "1" Accordingly a degree of activation of the internal combinational circuits in the burn-in test can be improved.

Further, the logical noninverted feedback loop circuit 109 inputs random signal values of the internal combinational circuit 104 to the internal combinational circuit 106 instead of the fixed value from outside the integrated circuit. Therefore, the logical noninverted feedback loop circuit 109 leads to further improvement for the degree of activation of the internal combinational circuits. A rate of circuit activation can be improved to the maximum extent possible.

Further, by generating the activation signal inside the integrated circuit 10, a generation feature of the activation signal needs not to be mounted in the burn-in test circuit on the burn-in board 4. Accordingly the wiring of the burn-in test board 4 can be simplified, thereby reducing workload of the burn-in test circuit.

As the activation signal needs not to be input to the integrated circuit 10 from the burn-in test apparatus 1, the number of input terminals mounted to the integrated circuit 10 can be reduced, thereby reducing the workload of the burn-in test circuit. This increases the number of integrated circuits to perform a burn-in test for at one time, thus an efficiency of the burn-in test can be improved and also cost for the burn-in test can be reduced.

Further, the integrated circuit 10 is able to generate the activation signal without mounting a complicated circuit such as the BIST circuit or the scan control signal selection output circuit. Therefore, the number of gates in the integrated circuit 10 will not be increased, and thus electric power consumption of the integrated circuit itself will not be increased as well.

Second Embodiment

Figure 4:
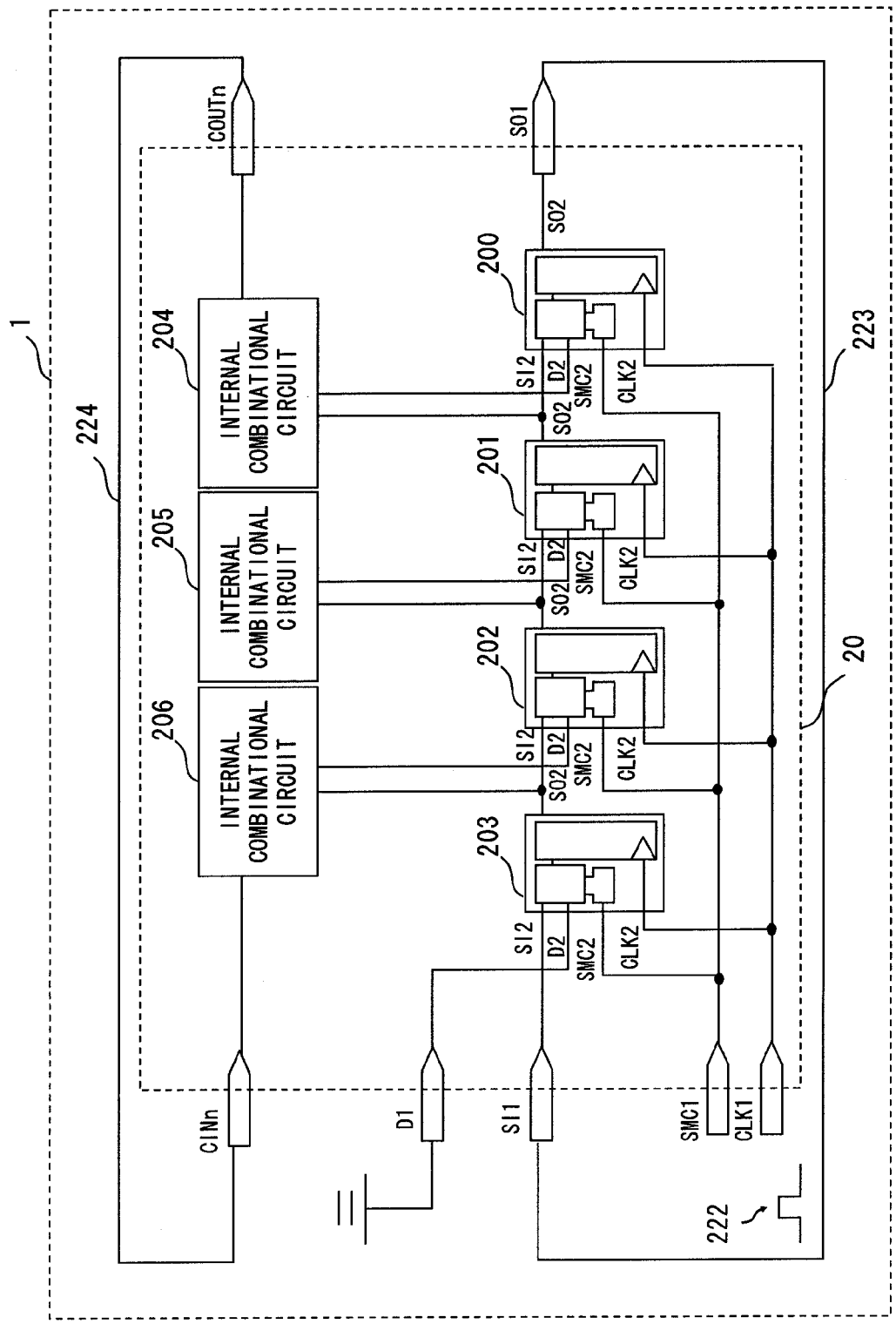
FIG. 4 is a configuration diagram illustrating a burn-in test circuit according to a second embodiment of the present invention.

A second embodiment of the present invention is described hereinafter in detail with reference to the drawings. FIG. 4 is a view illustrating a configuration of an integrated circuit 20 according to this embodiment. Components and principles of operation in the integrated circuit 20 that are identical to those in the first embodiment are denoted by reference numerals with detailed explanation omitted.

The integrated circuit 20 is configured by four scan FFs 200 to 203, and internal combinational circuits 204 to 206 that are connected between the scan FFs 200 to 203. The integrated circuit 20 further includes a logical noninverted feedback loop circuit 223 connected to an output from the scan FF 200, and a logical noninverted feedback loop circuit 224 connected to an output from the internal combinational circuit 204. The integrated circuit 20 is connected to a control unit of the burn-in test apparatus 1 via the burn-in test board 4 not shown.

The integrated circuit 20 as with the integrated circuit 10 includes a D1 terminal, a SI1 terminal, a SO1 terminal, a CLK1 terminal, a SMC1 terminal, a CINn terminal, and a COUTn terminal. The scan FFs 200 to 203 each includes a D2 terminal, a SI2 terminal, a SO2 terminal, a CLK2 terminal, and a SMC2 terminal.

The scan FFs 200 to 203 form a scan chain by their SI2 and SO2 terminals connected each other in series. The SI2 terminal of the scan FF 203 is connected to the SI1 terminal of the integrated circuit 20. The SO2 terminal of the scan FF 200 is connected to the SO1 terminal of the integrated circuit 20. Needless to say that the number of scan FFs forming the scan chain is not limited to four.

The internal combinational circuit 204 lies between the SO2 terminal of the scan FF 201 and the D2 terminal of the scan FF 200. Similarly the internal combinational circuit 205 lies between the SO2 terminal of the scan FF 202 and the D2 terminal of the scan FF 201. The internal combinational circuit 206 lies between the SO2 terminal of the scan FF 203 and the D2 terminal of the scan FF 202. The internal combinational circuits 204, 205, and 206 are activated by signals input from the scan FFs 201, 202, and 203 respectively. The internal combinational circuit 206 is connected to the CINn terminal of the integrated circuit 20. Further the internal combinational circuit 204 is connected to the COUTn terminal of the integrated circuit 20.

The SMC1 terminal is connected with the SMC2 terminals of the scan FFs 200 to 203. A signal input to the SMC1 terminal is a control signal for the scan FFs 200 to 203 to select an input signal among the signals input to the SI2 terminal and the D2 terminal. The CLK1 terminal is connected with the CLK2 terminals of the scan FFs 200 to 203. A clock signal 222 to be supplied inside the integrated circuit 20 from the CLK2 terminal provides a trigger to the scan shift or a scan capture operation etc. The D1 terminal is connected to ground, and inside the integrated circuit 20, the D1 terminal is connected to the D2 terminal of the scan FF 203.

The logical noninverted feedback loop circuit 233 feedback inputs an output signal from the scan FF 200 to the SI1 terminal. The logical noninverted feedback loop circuit 224 feedback inputs an output signal from the internal combinational circuit 204 to the CINn terminal.

Figure 5:
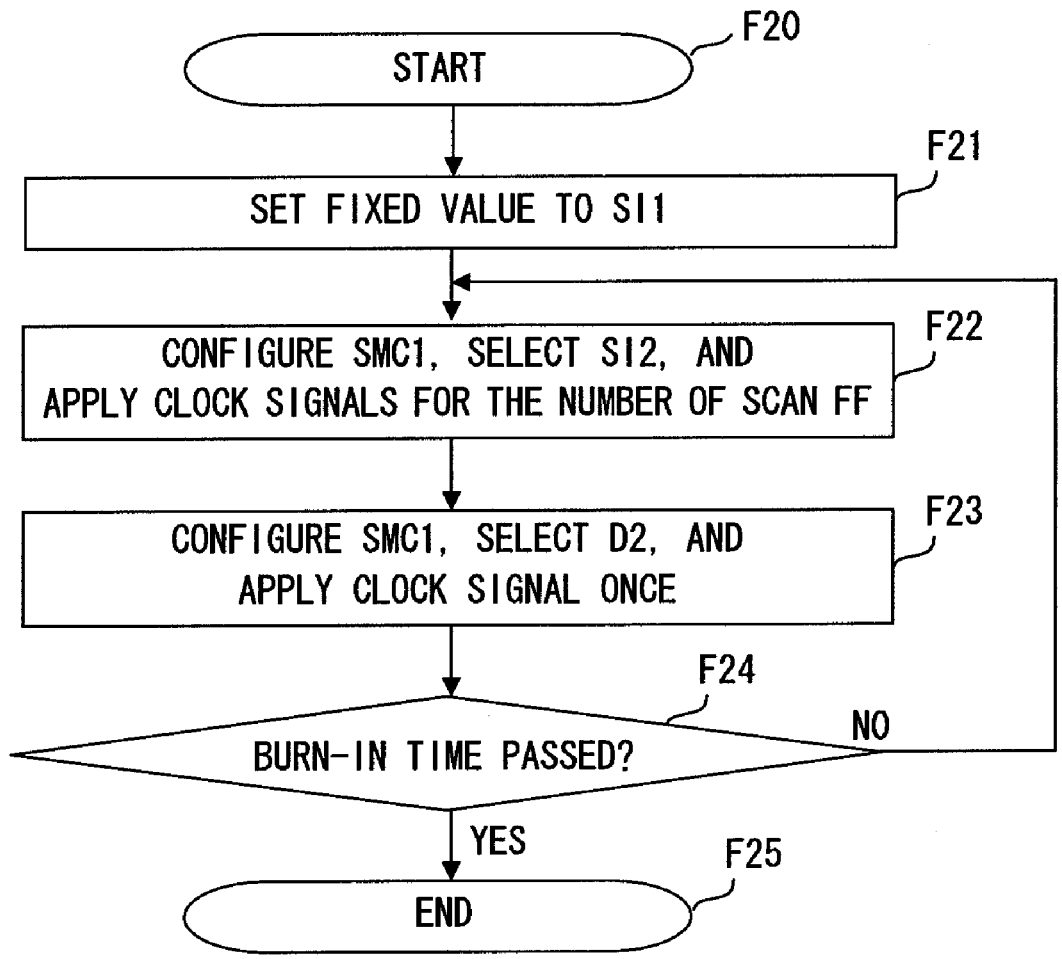
FIG. 5 is a flowchart illustrating a burn-in test pattern generation program according to the second embodiment of the present invention.

A burn-in test method of this embodiment is described hereinafter in detail with reference to FIG. 5. FIG. 5 is a flowchart illustrating the burn-in test method according to this embodiment. The burn-in test method is executed by the control unit 3 executing a test pattern generation program describing the process shown in the flowchart of FIG. 5.

An initial state in the burn-in test is that the fixed value is supplied to the SI1 terminal of the integrated circuit 20 (F21). The fixed value is assumed to be "1" here but may be set to "0".

Then the SMC1 terminal is configured so that the signal from the SI1 terminal or the scan FF, which is the signal input to the SI2 terminal is selected by the scan FFs 200 to 203 instead of the signal from the D1 terminal or the internal combinational circuits 204 to 206. After that clock signals for the number of cycles corresponding to the scan FFs are applied (F22). This causes a scan shift operation of the scan FFs 200 to 203, sequentially taking the signals input to the SI1 terminal in the scan FFs 200 to 203. Specifically, outputs from the scan FFs 100 to 103 are set to values at a power on. The clock signal may be applied any number of times not limited to the number of scan FFs as long as it is applied once.

Then the SMC1 terminal is configured so that the signal input to the D2 terminal is selected by the scan FFs 200 to 203 instead of the signal input to the SI2 terminal. Then one pulse of a clock signal is applied to the CLK1 terminal (F23). This causes a scan capture operation that takes signal values from the D1 terminal or the internal combinational circuits 204 to 206 in the scan FFs 200 to 203, and the outputs from the scan FFs 200 to 203 to be set as an input signal from the D1 terminal or input signals from the internal combinational circuits 204 to 206.

The internal combinational circuits 204 to 206 have various logics. Thus with combinations with the same signals being input, outputs will be different random values depending on the logics. In this embodiment, random signal of the internal combinational circuit 204 is supplied to the internal combinational circuit 206 by the logical noninverted feedback loop circuit 223. That is, even in case the input terminals of the scan FFs 200 to 203 are switched to the D2 terminals, random signal from the logical noninverted feedback loop circuit 223 is input to the internal combinational circuit 206 instead of the fixed value from the D1 terminal via the scan FF 203.

After repeating the operations of F21 and F22 for the predefined burn-in test time (F23), the burn-in test is completed.

In this embodiment with the configuration described in the foregoing, there are following advantageous effect in addition to those of the first embodiment of the present invention. That is, by the logical noninverted feedback loop circuit 223 for inputting the signal from the SO1 terminal to the SI1 terminal and the logical noninverted feedback loop circuit 224 for inputting the signal from the COUTn terminal, it is not necessary to input a signal to the TEST Terminal and to connect the SI1 terminal and the CINn terminal. Thus the wiring of the burn-in test board 4 can be simplified, and the workload of the burn-in test circuit on the burn-in test board 4 can further be reduced.

As the signal needs not to be input to the TEST terminal, the number of input terminals mounted to the integrated circuit 20 can be reduced, and the workload of the burn-in test apparatus 1 can be reduced as well. With the increased number of integrated circuits to perform a burn-in test at one time, an efficiency of the burn-in test can be improved and also cost for the burn-in test can be reduced.

In this embodiment, the logical noninverted feedback loop circuits 223 and 224 are formed outside the integrated circuit 20 such as the burn-in test board 4, and not inside the integrated circuit 20. Therefore, a different feedback loop circuit can be configured. Thus the burn-in test circuit on the burn-in test board 4 can be modified after manufacturing the integrated circuit 20 without modifying the integrated circuit 20. Therefore, physical limitations of the burn-in test apparatus 1 can be handled.

Third Embodiment

Figure 6:
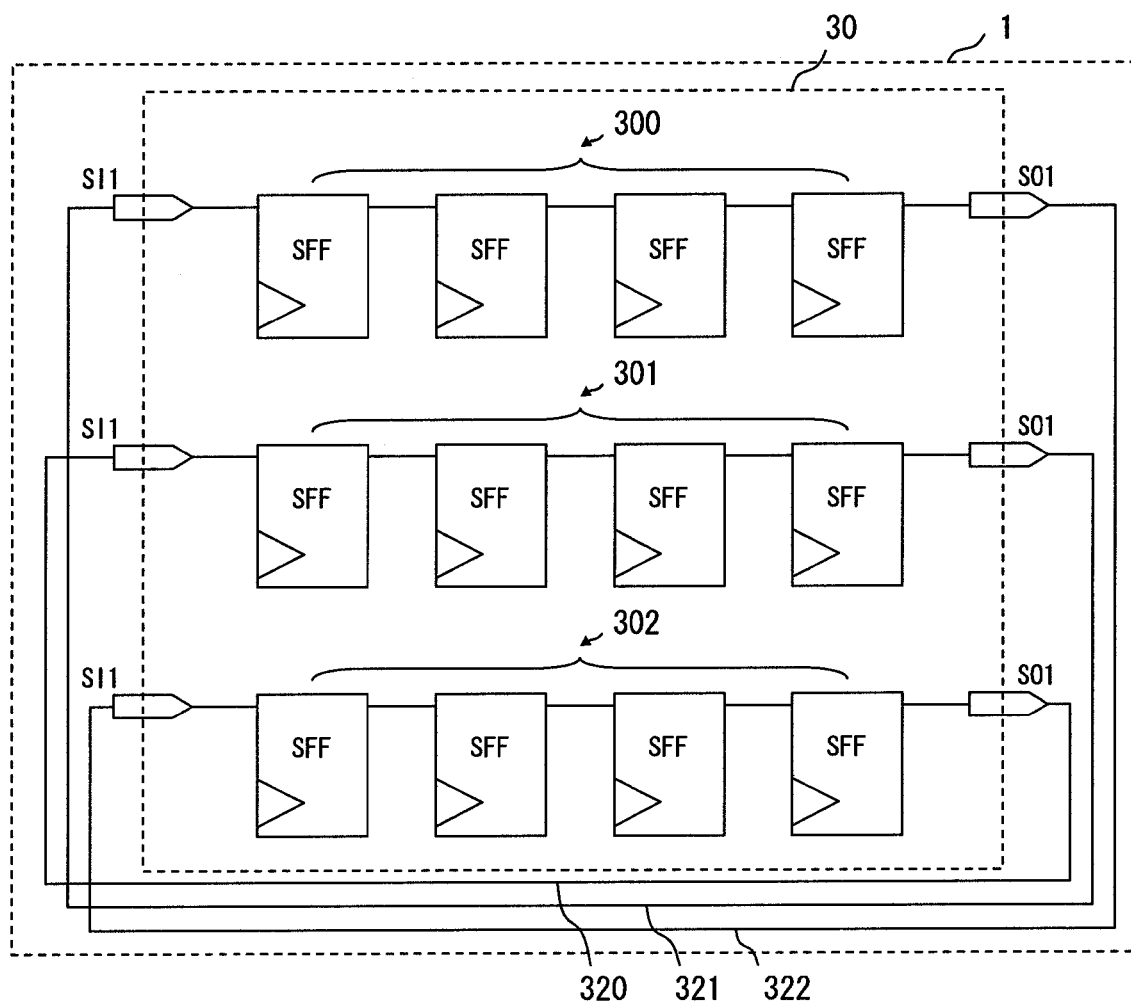
FIG. 6 is a configuration diagram illustrating a burn-in test circuit according to a third embodiment of the present invention.

A third embodiment of the present invention is described hereinafter in detail with reference to the drawings. FIG. 6 is a view illustrating a configuration of an integrated circuit 30 of the third embodiment. Components and principles of operation of the integrated circuit 30 that are identical to those in the first and the second embodiments are denoted by reference numerals with detailed explanation omitted.

The integrated circuit 30 is configured by three scan chains 300 to 302, which are formed by four scan FFs, for example. Each of the scan chains 300 to 302 has identical configurations as the second embodiment. The three scan chains 300 to 302 are connected in series by logical noninverted feedback loop circuits 320, 321, and 322 that connect between the SI1 and S01 terminals. The integrated circuit 30 is connected to the control unit of the burn-in test apparatus 1 via the burn-in test board 4 not shown.

A connection order of the scan chains may be modified. Not all the scan chains need to be connected in series. For example an output from one scan chain may feed back to the same scan chain. Needless to say that the number of scan FFs forming the scan chain in the integrated circuit 30 is not limited to three, and the number of scan FFs forming the scan chain is not limited to four. The burn-in method of this embodiment is identical to the flowchart of the second embodiment shown in FIG. 5.

With such configuration, the third embodiment is able to achieve following advantageous effects in addition to those of the second embodiment. Specifically, a feedback loop can be formed matching with physical position of the SO1 and SI1 terminals of the plurality of scan chains 300 to 302. This simplifies the wiring of the burn-in test board, thereby reducing the workload of the burn-in test circuit on the burn-in test board 4.

With the simplified wiring of the burn-in test board, a space needed for the burn-in test board can be reduced, thereby possible to increase the number of integrated circuits to perform a burn-in test for at one time. Further, it is possible to eliminate heat generated in the wiring of the burn-in test board, thereby reducing the workload of the burn-in test board.

Fourth Embodiment

Figure 7:
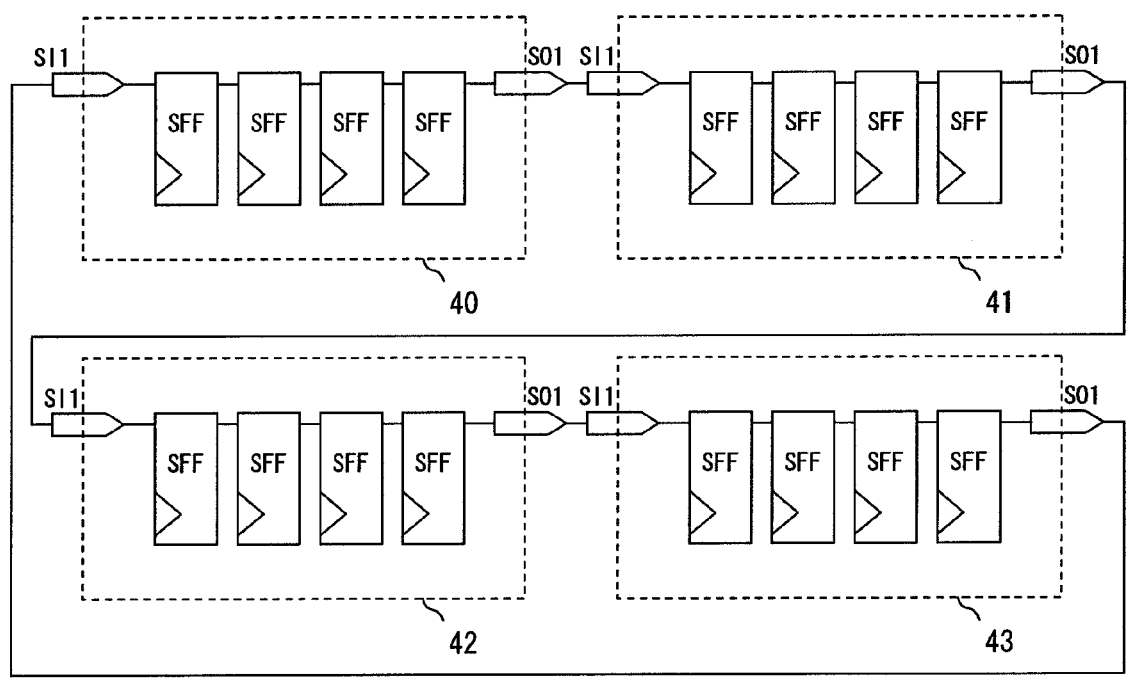
FIG. 7 is a configuration diagram illustrating a burn-in test circuit according to a fourth embodiment of the present invention.
Figure 8:
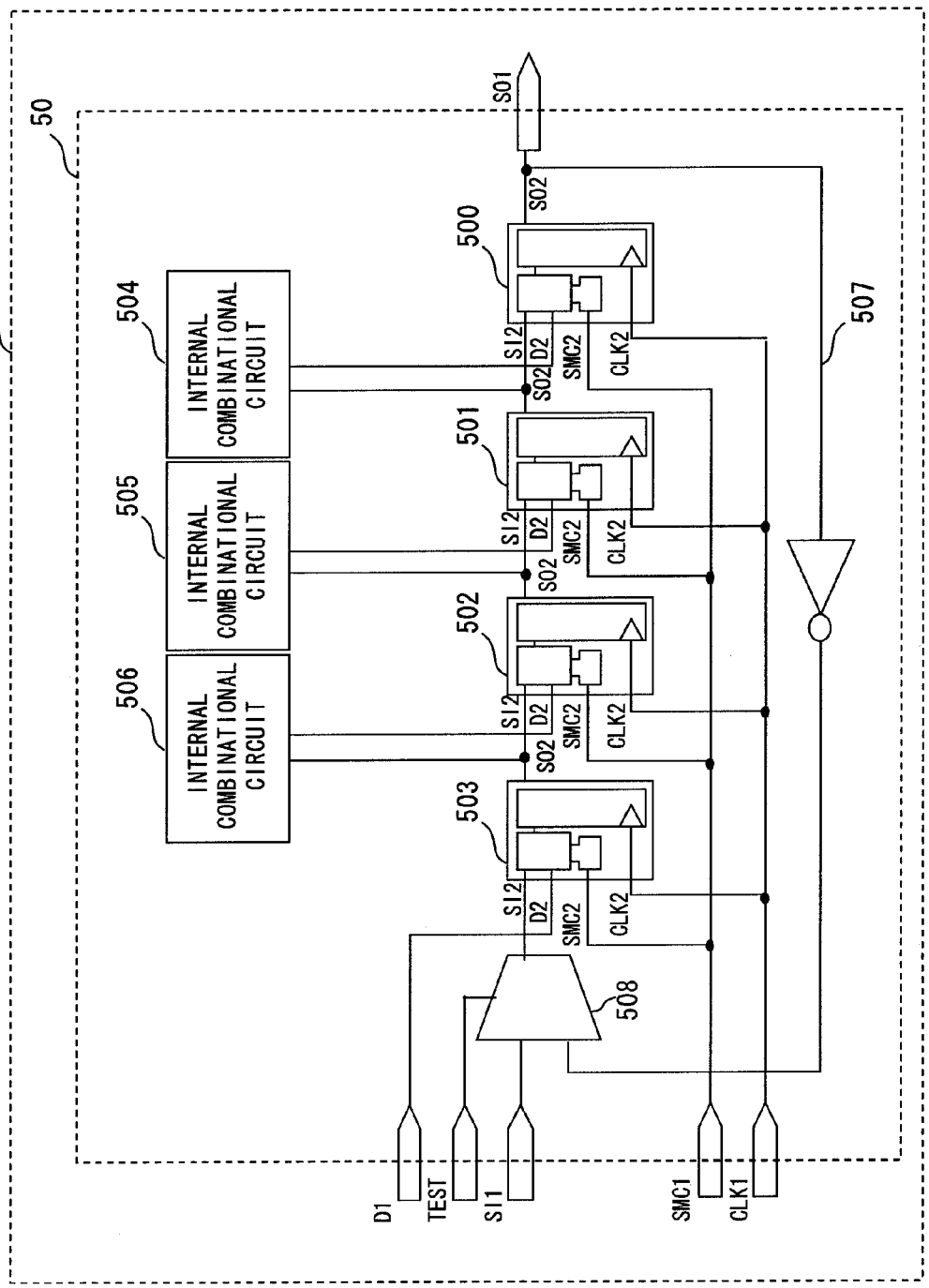
FIG. 8 is a configuration diagram illustrating a burn-in test circuit according to a conventional technique.

A fourth embodiment of the present invention is described hereinafter in detail with reference to the drawings. FIG. 7 is a view showing a configuration of a burn-in test circuit according to the fourth embodiment. Components and principles of operation in the burn-in test circuit that are identical to those in the first and the third embodiment are denoted by reference numerals with detailed explanation omitted.

Integrated circuits 40, 41, 42 and 43 each have a scan chain formed by four scan FFs, having the same configuration as the integrated circuit 20 of the second embodiment. The integrated circuits 40 to 43 are connected in series between the SI1 and SO1 terminals, and are connected to the control unit of the burn-in test apparatus 1 via the burn-in board 4 not shown.

A connection order of the integrated circuits 40 to 43 can easily be modified. Not all the integrated circuits need to be connected in series. For example an output from an integrated circuit may be feedback to an input of the same integrated circuit. Needless to say that the number of the integrated circuit placed into the burn-in test apparatus 1 is not limited to four. The burn-in method of the fourth embodiment is identical to the flowchart of the second embodiment shown in FIG. 5.

In the fourth embodiment with such configuration, following advantageous effects can be achieved. Specifically, a feedback loop can be formed matching with physical position of the SO1 and SI1 terminals of the integrated circuit in the burn-in test apparatus. This simplifies the wiring of the burn-in test board, thereby reducing the workload of the burn-in test circuit on the burn-in test board 4.

With the simplified wiring of the burn-in test board, a space needed for the burn-in test board can be reduced, thereby possible to increase the number of integrated circuits to perform a burn-in test for at one time. Further, it is possible to eliminate heat generated in the burn-in test board, thereby reducing the workload of the burn-in test board.

The present invention may be applied not only to a high temperature operation test, but to a normal temperature operation test, a low temperature operation test, and a temperature cycle operation test. Furthermore, the present invention may be applied to tests that continuously operate integrated circuit including a lot guarantee test and an operation check test.

It is apparent that the present invention is not limited to the above embodiment and it may be modified and changed without departing from the scope and spirit of the invention.

What is claimed is:

1. A burn-in test circuit comprising:
  a scan chain formed by a plurality of scan flip-flips connected in series;
  a circuit under test input with an output from one of the plurality of scan flip-flops as an activation signal; and
  a scan chain loop circuit being configured to feed an output signal of the scan chain back to the scan chain, the output signal of the scan chain being determined according to an output of the circuit under test.

2. The burn-in test circuit according to claim 1, wherein t the feedback input or an external input is selectively input to the scan chain.

3. The burn-in test circuit according to claim 1, further comprising a circuit under test loop circuit being configured to back an output signal of the circuit under test to an input of the circuit under test,
  wherein the circuit under test includes a plurality of internal combinational circuits, and
  the plurality of internal combinational circuits are able to input output signals of different scan flip-flops included in the plurality of internal combinational circuits as activation signals.

4. The burn-in test circuit according to claim 3, wherein the scan chain loop circuit and the circuit under test loop circuit are formed outside an integrated circuit where the scan chain and the circuit under test are formed thereto.

5. The burn-in test circuit according to claim 1, wherein the scan chain loop circuit is formed outside an integrated circuit where the scan chain and the circuit under test are formed thereto.

6. A method for burn-in test for an integrated circuit having a scan chain including a plurality of scan flip-flops connected in series, and a circuit under test that lies between the plurality of scan flip-flops, the method comprising:
    feeding an output signal from the scan chain determined according to an output from the circuit under test back to the scan chain;
    taking the fed back signal in the plurality of scan flip-flops by a scan shift operation; and inputting the output signal from one of the plurality of scan flip-flops to the circuit under test as an activation signal.

7. The method according to claim 6, wherein the feedback input or an external input is selectively input to the scan chain.

8. A burn-in test apparatus for executing the method according to claim 7.

9. A burn-in test pattern generation program product for storing instructions for a burn-in test apparatus to execute the method according to claim 7.

10. The method according to claim 6, further comprising feeding back an output signal of the circuit under test to the circuit under test,
    wherein the circuit under test includes a plurality of internal combinational circuits, and
    the plurality of internal combinational circuits are able to input output signals of different scan flip-flips included in the plurality of internal combinational circuits as activation signals.

11. A burn-in test apparatus for executing the method according to claim 10.

12. A burn-in test pattern generation program product for storing instructions for a burn-in test apparatus to execute the method according to claim 10.

13. A burn-in test apparatus for executing the method according to claim 6.

14. A burn-in test pattern generation program product for storing instructions for a burn-in test apparatus to execute the method according to claim 6.

* * * * *